United States Patent
Aigner et al.

(10) Patent No.: US 7,199,684 B2
(45) Date of Patent: Apr. 3, 2007

(54) FILTER CIRCUIT WITH A FILTER STAGE AND BALUN ON A SINGLE SUBSTRATE

(75) Inventors: Robert Aigner, Unterhaching (DE); Juha Sakari Ellae, Halikko (FI); Stephan Marksteiner, Neubiberg (DE); Hans-Jörg Timme, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/045,500

(22) Filed: Jan. 28, 2005

(65) Prior Publication Data

US 2005/0212619 A1  Sep. 29, 2005

Related U.S. Application Data

(63) Continuation of application No. PCT/EP03/07015, filed on Jul. 1, 2003.

(30) Foreign Application Priority Data

Jul. 30, 2002  (DE) ................. 102 34 685

(51) Int. Cl.
*H03H 9/54* (2006.01)
(52) U.S. Cl. .......................... 333/189; 333/25
(58) Field of Classification Search .............. 333/25, 333/26, 189, 193
See application file for complete search history.

(56) References Cited

U.S. PATENT DOCUMENTS

| | | | |
|---|---|---|---|
| 3,374,448 A | 3/1968 | Hurtig | 333/190 |
| 4,623,894 A * | 11/1986 | Lee et al. | 343/700 MS |
| 5,430,895 A | 7/1995 | Huusko | 455/327 |
| 5,789,845 A | 8/1998 | Wadaka et al. | 310/334 |
| 5,790,000 A * | 8/1998 | Dai et al. | 333/193 |
| 5,994,980 A | 11/1999 | Tada | 333/193 |
| 6,670,866 B2 * | 12/2003 | Ella et al. | 333/133 |
| 6,768,396 B2 | 7/2004 | Klee et al. | 333/187 |
| 6,803,835 B2 * | 10/2004 | Frank | 333/26 |
| 6,927,649 B2 * | 8/2005 | Metzger et al. | 333/133 |
| 2002/0021192 A1 | 2/2002 | Klee et al. | 333/187 |

FOREIGN PATENT DOCUMENTS

| | | |
|---|---|---|
| DE | 692 18 104 T2 | 9/1997 |
| DE | 199 62 028 A1 | 6/2001 |
| EP | 1 202 454 A2 | 5/2002 |
| EP | 0 836 278 B1 | 7/2002 |
| EP | 1 225 695 A2 | 7/2002 |
| JP | 2000114917 | 4/2000 |
| JP | 2000244337 | 9/2000 |
| WO | WO 98/34345 * | 8/1998 |

* cited by examiner

*Primary Examiner*—Barbara Summons
(74) *Attorney, Agent, or Firm*—Maginot, Moore & Beck (57) ABSTRACT

A filter circuit comprises a balanced port, an unbalanced port and a substrate. A series circuit of a filter stage and a balun is disposed between the balanced port and the unbalanced port. The balun and the filter stage are formed on the substrate.

13 Claims, 4 Drawing Sheets

FILTER CIRCUIT WITH A FILTER STAGE AND BALUN ON A SINGLE SUBSTRATE

CROSS-REFERENCE TO RELATED APPLICATION

This application is a continuation of copending International Application No. PCT/EP03/07015, filed Jul. 1, 2003, which designated the United States and was not published in English.

BACKGROUND OF THE INVENTION

1. Field of the Invention

The present invention relates to a filter circuit, particularly to a filter circuit for converting unbalanced/balanced signals into balanced/unbalanced signals, and here particularly to a filter circuit comprising BAW resonators (BAW=bulk acoustic wafer). Further, the present invention relates to a filter circuit with a plurality of BAW resonators, which enables a transformation of impedance levels between an input port and an output port of the filter circuit.

2. Description of the Related Art

RF filters based on resonators, such as BAW filters, have two basic topologies, which will be discussed in more detail with regard to FIGS. 1 and 2.

The first topology (see FIG. 1) is the so-called ladder filter. The ladder filter 100 comprises an input port 102 with a first input terminal 104 and a second input terminal 106. Further, the filter 100 comprises an output port 108 with a first output terminal 110 and a second output terminal 112. An input signal IN is applied to the first input terminal 104 of the input port 102, and an output signal OUT is applied to the first output terminal 110 of the output port 108. In the filter 100 shown in FIG. 1, two series resonators $R_{s1}$ and $R_{s2}$ are connected in series between the first input terminal 104 and the first output terminal 110. Further, two parallel resonators $R_{p1}$ and $R_{p2}$ are provided. The first parallel resonator $R_{p1}$ is connected in parallel to the input port 102 as well as in parallel to the first series resonator $R_{s1}$. The second parallel resonator $R_{p2}$ is connected in parallel to the output port 108 as well as in parallel to the second series resonator $R_{s2}$. The second input terminal 106 as well as the second output terminal 112 are connected to a reference potential 114, e.g. ground. The parallel resonators $R_{p1}$ and $R_{p2}$ are also connected to the reference potential. The conventional filter illustrated in FIG. 1 is a ladder filter with two stages with a single input IN and a single output OUT for transmitting unbalanced signals.

Figure 1:
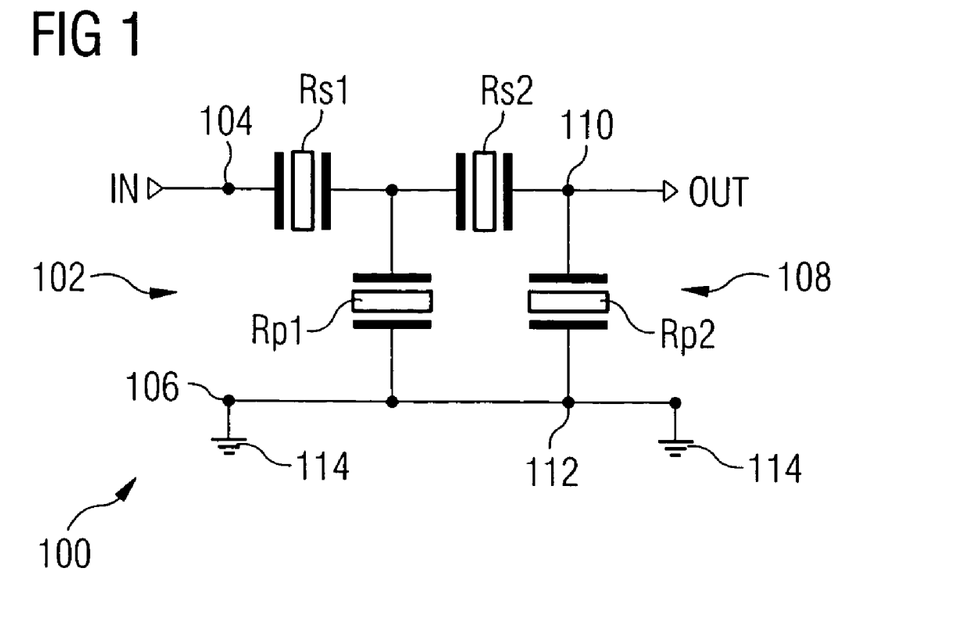
FIG. 1 is a known ladder filter with two stages consisting of two series resonators and two parallel resonators.
Figure 2:
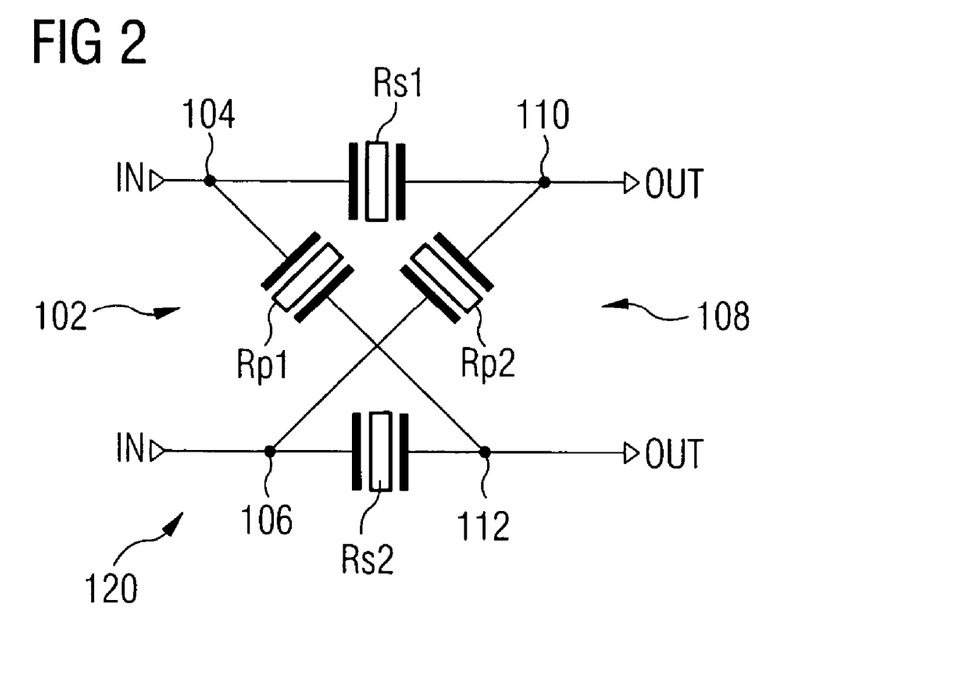
FIG. 2 is a known lattice filter with one stage and two series resonators and two parallel resonators.

In FIG. 2, a known lattice filter (bridge filter) with one stage (two series resonators and two parallel resonators) is discussed in more detail. In the description of FIG. 2, similar or equal devices already described with reference to FIG. 1 will be provided with the same reference numbers.

The lattice filter 120 receives a balanced input signal IN at the first input terminal 104 and at the second input terminal 106 of the input port 102. A balanced output terminal OUT is output at the output signal 108 at the terminals 110 and 112. A series resonator $R_{s1}$ is provided between the first input terminal 104 and the first output terminal 110. Likewise, a series resonator $R_{s2}$ is provided between the second input terminal 106 and the second output terminal 112. A first parallel resonator $R_{p1}$ is connected between the first input terminal 104 and the second output terminal 112. A second parallel resonator $R_{p2}$ is connected between the second input terminal 106 and the first output terminal 110. The filter 120 shown in FIG. 2 is fully differential, i.e. both input ports 102 and 110 are balanced.

Filters with good selectivity and low insertion loss can be produced by using BAW resonators, which are used to construct individual blocks or stages of impedance element filters. These filters have two basic topologies, which will be discussed in more detail with reference to FIGS. 1 and 2.

With regard to the filters described with reference to FIGS. 1 and 2, it should be noted that the series resonators and parallel resonators are preferably BAW resonators, wherein the series resonators and the parallel resonators are produced with a predetermined resonance frequency, respectively. The resonance frequencies of the parallel resonators are preferably off-tune to the resonance frequencies of the series resonators to obtain the desired filter effect. It should be noted that the series resonators and the parallel resonators used in the ladder filter 100 differ from the series resonators and parallel resonators used in the lattice filter 120, particularly in filter circuits with mainly equal filter characteristics but different topology.

However, in the ladder filter 100, there is merely the possibility to receive an unbalanced input signal and to output a respective unbalanced output signal. Also, the lattice filter 120 allows merely the reception of a balanced input signal and the output of a balanced output signal.

There are, however, applications where it is required to perform a transformation/conversion of an unbalanced input signal into a balanced output signal, or a transformation/conversion of a balanced input signal into an unbalanced output signal. Further, there are applications where alternatively or additionally to the conversion of balanced/unbalanced signals into unbalanced/balanced signals different port impedances exist at the inputs and outputs, which also have to be handled.

A traditional method to perform a respective conversion/transformation is to provide an additional component, which is referred to as balun. The balun can either be a magnetic transformer, an LC circuit or a strip-line structure, wherein the balun is disposed on a printed circuit board before or after the filter circuits shown in FIGS. 1 and 2. The usage of discrete baluns before or after the filters is a possibility but increases the number of required components and the required space on the printed circuit board.

In surface acoustic wave filters (SAW filters), an acoustic balancing function can be implemented without additional components, it does, however, decrease the behavior of the overall filter significantly. Further, this balancing function leads to the filter being very sensitive against electrostatic discharges and further the possibilities of manipulating powers are limited drastically, i.e. the transmittable powers across such a filter structure are very low. One example for such an SAW filter is described in JP 2000-114917A. It is another disadvantage of the coupled SAW filter that the response of these filters is generally worse than the response of impedance element filters, particularly the so-called roll-off or the selectivity near the pass band.

One solution for converting unbalanced signals into balanced signals is, for example, described in EP 1 202 454 A according to which filter structures, similar to the ones in FIGS. 1 and 2 are combined, which means the lattice filter is connected to the output of the ladder filter. However, this solution has significant disadvantages for the practical application of such a filter and is particularly disadvantageous in that it can only be related to floating differential loads, which means no RF leaking current against ground is allowed.

In connection with BAW filters, no solution is known that would suggest in what way an impedance transformation could be performed.

SUMMARY OF THE INVENTION

It is the object of the present invention to provide an improved filter circuit, which enables a conversion of balanced/unbalanced into unbalanced/balanced signals in a simple way, wherein the filter stage and the balun are formed on the substrate.

The present invention provides a filter circuit with a balanced port, an unbalanced port, a substrate and a series circuit of a filter stage and of a balun, disposed between the balanced port and the unbalanced port, wherein the balun and the filter stage are formed on the substrate.

Preferably, the filter stage of the series circuit comprises a plurality of BAW resonators and here at least one series BAW resonator and at least one parallel BAW resonator.

According to a first preferred embodiment, the filter stage is an unbalanced filter stage connected to the unbalanced port, and the balun is connected to the balanced port.

According to a further embodiment, the filter stage is a balanced filter stage connected to the balanced port and the balun is connected to the unbalanced port.

According to another embodiment, the filter stage is a balanced filter stage connected to the balanced port, and further the series circuit comprises an unbalanced filter stage connected to the unbalanced port. In this embodiment, the balun is connected between the balanced filter stage and the unbalanced filter stage. All filter stages and the balun are formed on the same substrate here as well.

Additionally, it can be provided to provide adaption elements in the series circuit, which are connected between the filter stage and the unbalanced port or the balanced port and are formed on the substrate together with the elements of the filter stage and the elements of the balun.

Preferably, the balun is a transformer element, which has at least two coils formed on the substrate.

According to a further preferred embodiment of the present invention, the coils of the balun are chosen such that they have different turn numbers so that due to the resulting winding ratio an impedance transformation is effected between the two ports of the filter circuit.

The substrate is preferably a substrate with high resistance, where the coils are formed, for example, by metal traces. Alternatively, the coil can be disposed on the substrate in an area where an acoustic reflector is provided.

Thus, the present invention provides an RF filter and particularly RF filters which are realized by using the BAW technology, which includes additional monolithic passive elements, such as transducers (baluns) but also additionally coils, capacitors or resistor elements.

The present invention is based on the knowledge that a combination of the desired features of impedance element filters with the possibility to convert unbalanced/balanced signals into balanced/unbalanced signals can be obtained by modifying a general production process of the BAW resonators, such that additionally monolithic baluns can be produced on the filter chips (substrates). This opens up also the possibility of impedance level transformation between the input ports of the filters.

According to the invention it is made possible to use impedance element filters and at the same time perform a transformation of balanced/unbalanced signals into unbalanced/balanced signals and, if necessary, additionally an impedance level transformation within the filter chip in monolithic form, which means without external components. Preferably, the baluns are two spiral-shaped coils disposed on top of one another and magnetically coupled to one another.

It is an advantage of the present invention that a process used for producing the baluns also opens up the possibility to generate monolithic coils (spiral-shaped inductivities) with high Q factors, which can then be used as elements of the balun or additionally as adaption elements. At present, these adaption elements in conventional filter circuits are realized as external elements outside the filter chips, which causes the above-mentioned problems.

It is another advantage of the present invention that additionally to the inductivities capacitors can be produced in a simple way, which means also as monolithic elements on the filter chip since different layers of dielectric materials are used for producing the BAW resonators. The capacitors generated that way can be used as adaption capacitors or as coupling capacitors.

Compared to conventional BAW production methods, merely minor modifications are required, which are required to produce the thick metals which are required to obtain the elements (balun, inductivity, capacitor). Additional masking layers will be required, which, however, lead only to minor increase of the overhead of the process.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

In the following description of the preferred embodiments of the present invention, equal or similar elements are provided with the same reference numbers.

Figure 3:
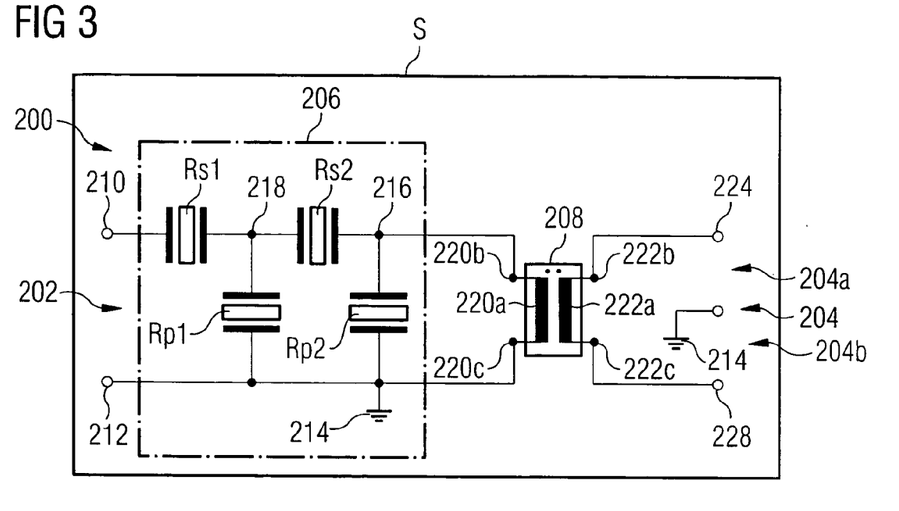
FIG. 3 is a first embodiment of the inventive filter circuit with an unbalanced filter stage at an unbalanced input port and a balun at a balanced output.

FIG. 3 shows a first embodiment of the inventive filter circuit 200. The filter circuit 200 comprises an unbalanced terminal 202 and a balanced terminal 204 with the two balanced ports 204a and 204b. A series circuit consisting of a filter stage 206 and a balun 208 is connected between the unbalanced terminal 202 and the balanced terminal 204. In the embodiment illustrated in FIG. 3, the filter stage 206 is an unbalanced filter stage in the form of a ladder filter as it has been described exemplarily with regard to FIG. 1. The filter stage 206 comprises two series resonators $R_{s1}$ and $R_{s2}$ as well as two parallel resonators $R_{p1}$ and $R_{p2}$.

The unbalanced terminal 202 comprises a first node 210 and a second node 212. The second node 212 is connected to a reference potential 214, e.g. ground. The filter stage 206 comprises a series circuit consisting of the two series resonators $R_{s1}$ and $R_{s2}$ connected between the first node 210 and a third node 216. The first parallel resonator $R_{p1}$ is connected between the reference potential 214 and a node 218 between the first series resonator R., and the second series resonator $R_{s2}$. The second parallel resonator $R_{p2}$ is connected between the third node 216 and the reference potential 214.

The balun 208 is formed by two coupled coils 220a and 222a, wherein a first terminal 22b of the first coil 220a is connected to the third node 216. A second terminal 220c of the first coil 220a is connected to the reference potential 214.

The first port 204a of the balanced terminal 204 comprises a first node 224 as well as a second node 226 connected to the reference potential 214. Also, the second port 204b comprises a first terminal 228 and also the node 226 shared with the first port 204a.

The balanced signals are tapped and received, respectively, between the nodes 224 and 226 and the nodes 228 and 226, respectively.

A first terminal 222b of the second coil 222a of the balun 208 is connected to the first node 224 of the first balanced port 204a. A second terminal 222c of the second coil 222a is connected to the first node of the second balanced port 204b.

Thus, FIG. 3 shows a topology of a ladder filter combined with a balun. The filter itself has a ladder structure and can have more than the two stages shown there to improve selectivity. Additionally, the stages can have differently sized series and parallel resonators to further improve selectivity. In the preferred embodiment of the present invention, the baluns are mainly two spiral-shaped coils, which are coupled magnetically.

In order to keep the resistive losses and the parasitic capacity low, it is desirable to generate the metals used for producing the coil elements with a sufficient thickness by using a modified BAW production process. The thickness of the used metal traces or metal areas should be such that it is in the range of 800 nm to 10 μm and larger by a factor of 2 to 20 compared to the thickness of the electrode metals used in the BAW resonators, respectively.

The elements of the filter stage shown in FIG. 3 as well as the elements of the balun 208 are formed together on a chip or substrate S, as it is schematically illustrated in FIG. 3. This requires, as it has already been mentioned above, merely a slight modification of the production processes for the BAW resonators, which includes only slightly higher cost but has the advantage that external components on a circuit board, where the chip S is disposed, are avoided. Further, this leads to easing the whole production process.

The substrate S is preferably a substrate with high resistance and the coils are preferably isolated from the substrate by one or several dielectric layers. According to a preferred embodiment of the present invention, this can be realized in a simple way, since here the required acoustic reflector for the BAW resonators is formed in the substrate S and the extension of the same is chosen such that above the same the balun 208 can additionally be formed.

According to one embodiment, the balun has a winding ratio of 1:1, but the number of turns in the primary and secondary windings can be changed to obtain a desired impedance level transformation between the terminals 202 and 204.

The present invention has the advantage that the integration of the balun 208 as well as the integration of further coils and capacitors within a filter structure based on BAW resonators can be achieved on the same substrate S, wherein only a few additional masking steps are required. The combination of balun and filter stage can have different topologies, where it can be generally chosen whether filtering is to be performed prior to or after the transformation. In the first case, the filter stage would contain a ladder filter structure and in the latter case a lattice filter structure. The lattice filter structure is preferred, due to the increased attenuation outside the pass band compared to ladder filter structures.

Figure 4:
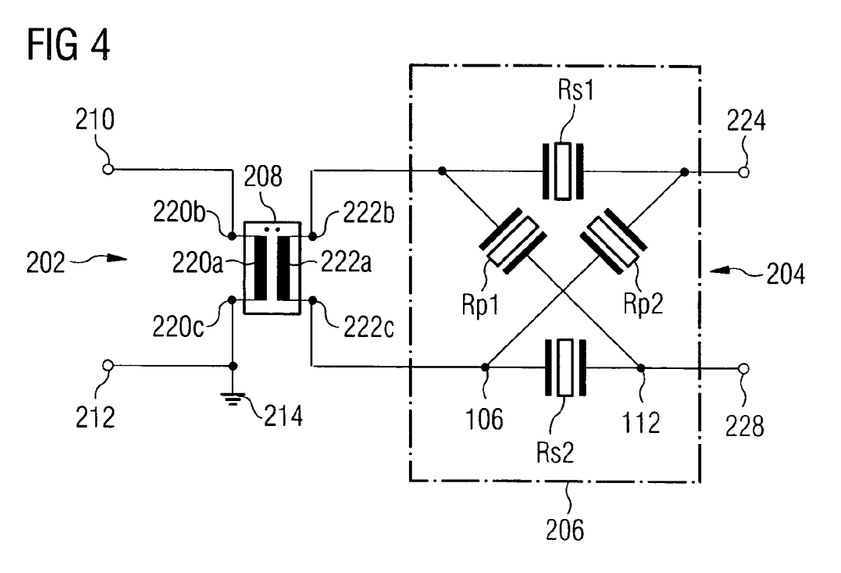
FIG. 4 is a second embodiment of the inventive filter circuit with a balanced filter stage at a balanced port and a balun at an unbalanced port.

Further embodiments of the present invention will be discussed below in more detail with reference to FIGS. 4–6, wherein FIG. 4 shows a second embodiment where a lattice filter structure is used instead of the ladder filter structure used in FIG. 3, connected to the balanced input 204 of the filter circuit. The balun 208 is connected between the filter stage 206 and the unbalanced input 202.

In the embodiment illustrated in FIG. 4, in the filter stage 206, a first series resonator $R_{s1}$ is connected between the first terminal 222b of the second coil 222a of the balun 208 and the terminal 224 of the balanced output 204. A second series resonator $R_{s2}$ is connected between the second terminal 222c of the second coil 222a of the balun 208 and the second terminal 228 of the balanced output 204. A first parallel resonator $R_{p1}$ is connected between the first terminal 222b of the second coil 222a and the second node 228 of the balanced terminal 204, and a second parallel resonator $R_{p2}$ is connected between the second terminal 222c of the second coil 222a and the first node 224 of the balanced terminal 204.

The first node 210 of the unbalanced terminal 202 is connected to the first terminal 220b of the first coil 220a of the balun 208, and the second node 220c of the first coil 220a is connected to the reference potential 214, as well as the first node 212 of the unbalanced terminal 202.

Similar to the embodiment shown in FIG. 3, the BAW resonators $R_{s1}$, $R_{s2}$, $R_{p1}$, $R_{p2}$ are also formed together with the elements of the balun 208 on a common substrate or chip.

Figure 5:
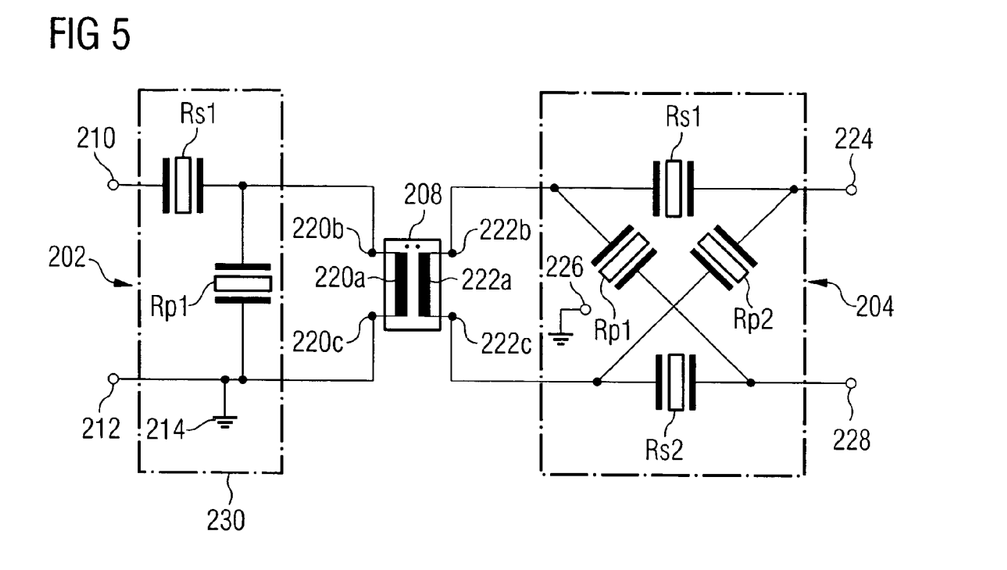
FIG. 5 is a third embodiment of the inventive filter circuit with a balanced filter stage at the balanced port, an unbalanced filter stage at the unbalanced port and a balun disposed between the two filter stages.

FIG. 5 shows a further embodiment of the present invention, which differs from the one illustrated in FIG. 4 in that a further filter stage 230 has been connected between the unbalanced terminal 202 and the balun 208, in the illustrated embodiment an unbalanced filter stage in the form of a one-stage ladder filter. The filter stage 230 comprises a series resonator $R_{s1}$ connected between the first node 210 of the unbalanced terminal 202 and the first terminal 220b of the first coil 220a of the balun 208. Further, a parallel resonator $R_{p1}$ is provided which is connected between the first terminal 220b of the first coil 220a and the reference potential 214.

Also in the embodiment shown in FIG. 5, all BAW resonators as well as all elements of the balun are formed on a common substrate.

Figure 6:
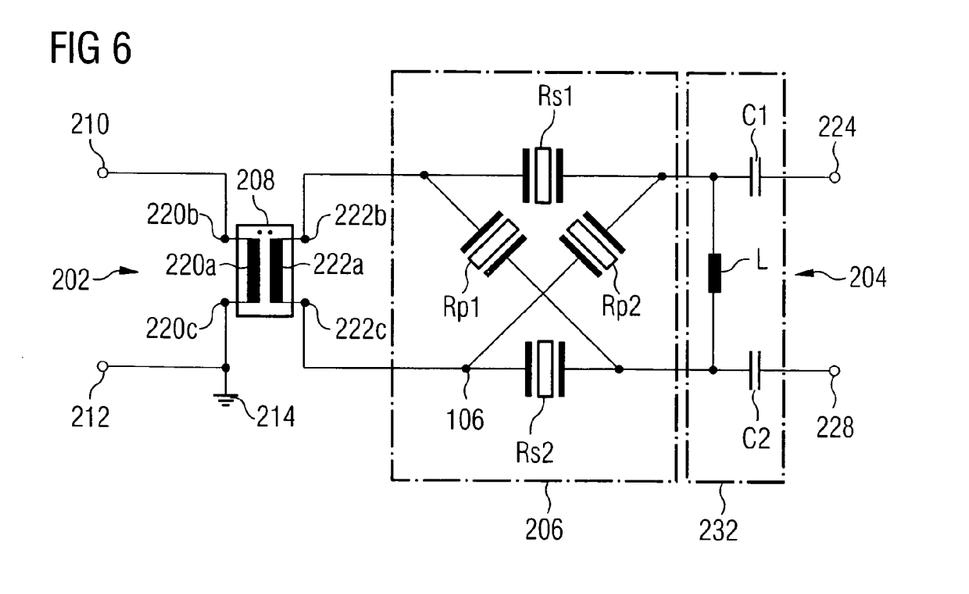
FIG. 6 is a fourth embodiment of the inventive filter circuit similar to the one shown in FIG. 4 which additionally comprises adaption elements.

FIG. 6 shows a further embodiment where additionally to the embodiment illustrated in FIG. 4 an adaption block 232 is connected between the filter stage 206 and the balanced output 204.

The block 232 comprises an inductive device L as well as two capacitive devices $C_1$ and $C_2$. Both the capacitive devices and the inductive device are formed together with the elements of the balun 208 and the BAW resonators of the filter stage 206 on the filter chip. Compared to FIG. 4, the capacitive device $C_1$ is connected between the first series resonator $R_{s1}$ of the filter stage 206 and the first node 224 of the balanced output 204. The second capacitive device $C_2$ is connected between the second series resonator $R_{s2}$ of the filter stage 206 and the second node 228 of the balanced terminal 204. The inductive device L is connected parallel to the balanced output terminal 204 between a node between the first series resonator $R_{s1}$ and the first capacitive device $C_1$ and a node between the second resonator $R_{s2}$ and the second capacitive device $C_2$.

Figure 7:
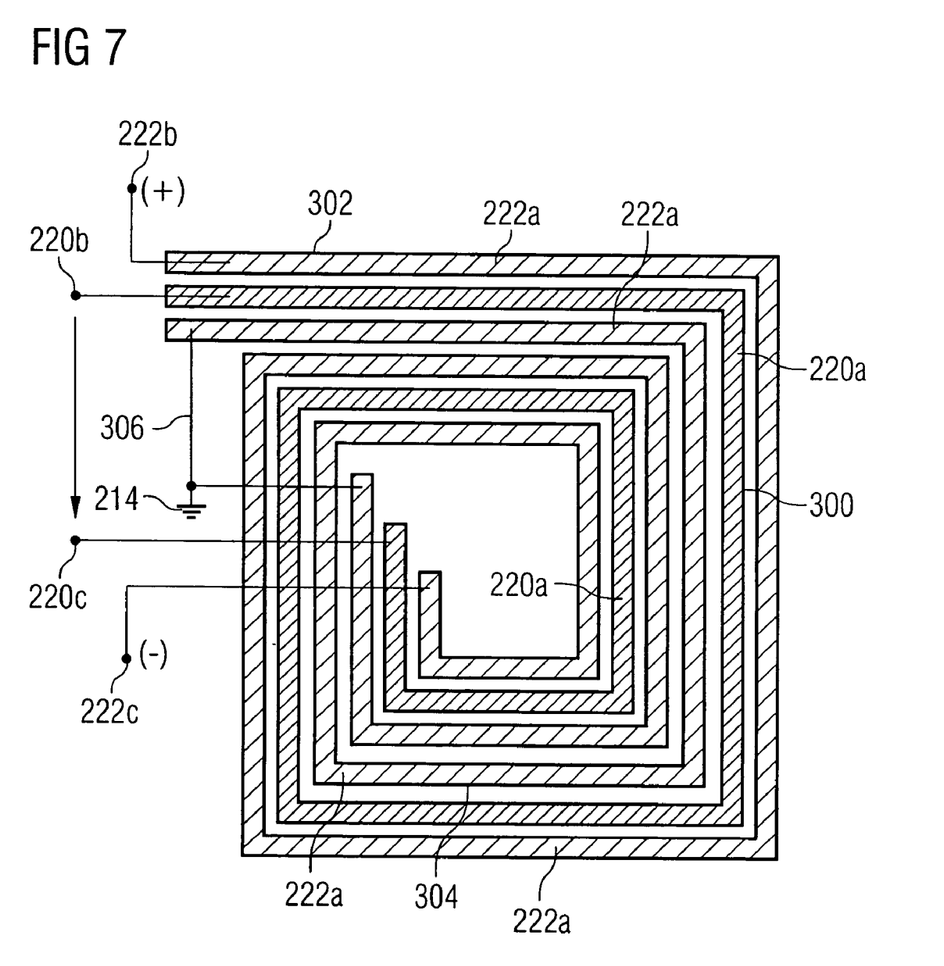
FIG. 7 is a schematic exemplary illustration for a planar balun structure.

An example for an implementation of a planar balun structure will be discussed below in more detail with regard to FIG. 7. A planar structure is shown in FIG. 7, which is formed of a plurality of metallic traces. The coils are formed by a plurality of spiral-shaped disposed metallic traces 300, 302 and 304, wherein the traces 302 and 304 are connected to the reference potential 214 and through the electrical connection 306 to each other. The second coil 222a of the balun 208 is formed by the traces 302 and 304, which are connected in the above-described manner and the terminals 222b, and 222c are illustrated in FIG. 7. The first coil 220a is formed by the trace 300 and its terminals 220b and 222c are also illustrated.

With regard to the above description it should be noted that as long as reference has been made to inputs and outputs, these are generally interchangeable. This means that the direction of the signal flow can be reversed, so that all structures are suitable to use, for example, an unbalanced signal source and a balanced load or an unbalanced load and a balanced signal source.

It is the advantage of the present invention that the same comprises, in contrary to the prior art, a miniaturized magnetic transformer as additional element, which has been produced monolithically together with the elements of the filter stage.

The above description has been made with regard to preferred embodiments, wherein it is, however, obvious that the present invention is not limited to the described embodiments. Additionally to the described embodiments, the inventive filter circuits can comprise one or several stages on the input side and/or output side.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

| Reference number list | |
|---|---|
| 100 | ladder filter |
| 102 | input port |
| 104 | first input terminal of input port |
| 106 | second input terminal of input port |
| 108 | output port |
| 110 | first output terminal of output port |
| 112 | second output terminal of output port |
| 114 | reference potential |
| 120 | lattice filter |
| 200 | filter circuit |
| 202 | unbalanced terminal |
| 204 | balanced terminal |

-continued

| Reference number list | |
|---|---|
| 204a | balanced port |
| 204b | balanced port |
| 206 | filter stage |
| 208 | balun |
| 210, 212 | nodes |
| 214 | reference potential |
| 216, 218 | nodes |
| 220a | first coil |
| 220b | first terminal of first coil |
| 220c | second terminal of first coil |
| 222a | second coil |
| 222b | first terminal of second coil |
| 222c | second terminal of second coil |
| 224, 226 | nodes of balanced terminal 204 |
| 228 | nodes of balanced terminal 204 |
| 230 | further filter stage |
| 232 | adaption stage |
| 300, 302 | metal trace |
| 304 | metal trace |
| 306 | connection element |
| $R_{s1}, R_{s2}$ | series resonator |
| $R_{p1}, R_{p2}$ | parallel resonators |

What is claimed is:

1. A filter circuit, comprising:

a balanced port;

an unbalanced port;

a substrate; and a series circuit comprising a filter stage and a balun, disposed between the balanced port and the unbalanced port, wherein the filter stage is a balanced filter stage connected to the balanced port and wherein the series circuit further comprises an unbalanced filter stage connected to the unbalanced port, wherein the balun is connected between the balanced filter stage and the unbalanced filter stage and wherein the balanced filter stage, the unbalanced filter stage, and the balun are formed on the substrate.

2. The filter circuit according to claim 1, wherein at least one of the filter stages comprises at least one series BAW resonator and at least one parallel BAW resonator.

3. The filter circuit according to claim 1, wherein the series circuit further comprises at least one adaption element connected between the unbalanced filter stage and the unbalanced port or between the balanced filter stage and the balanced port, wherein the at least one adaption element is formed on the substrate.

4. The filter circuit according to claim 1, wherein the balun is a transformer element with two coils, wherein the coils are formed on the substrate.

5. The filter circuit according to claim 4, wherein the coils have a winding ratio to effect an impedance transformation between the unbalanced port and the balanced port.

6. The filter circuit according to claim 4, wherein the substrate has a high resistance and wherein the coils are formed on the substrate by metal traces.

7. The filter circuit according to claim 6, wherein the metal traces of the coils are formed with a thickness between 800 nm and 1 µm.

8. The filter circuit according to claim 4, wherein at least one of the filter stages comprises at least one BAW resonator, and wherein the substrate has an acoustic reflector and the at least one BAW resonator and the coils are formed above the acoustic reflector.

9. The filter circuit according to claim 1, wherein the substrate comprises at least part of a chip.

10. A filter circuit, comprising:
a balanced port;
an unbalanced port;
a substrate; and
a series circuit comprising a filter stage and a balun, the series circuit disposed between the balanced port and the unbalanced port, wherein the balun and the filter stage are formed on the substrate.
wherein the balun is a transformer element with two coils, wherein the coils are formed on the substrate, and
wherein the substrate has a high resistance and wherein the coils are formed on the substrate by metal traces.

11. The filter circuit according to claim 10, wherein the coils have a winding ratio to effect an impedance transformation between the unbalanced port and the balanced port.

12. A filter circuit, comprising:
a balanced port;
an unbalanced port;
a substrate; and
a series circuit comprising a filter stage and a balun, the series circuit disposed between the balanced port and the unbalanced port, wherein the balun and the filter stage are formed on the substrate;
wherein the balun is a transformer element with two coils, wherein the coils are formed on the substrate; and
wherein the filter stage comprises at least one BAW resonator, and wherein the substrate has an acoustic reflector and the at least one BAW resonator and the coils are formed above the acoustic reflector.

13. The filter circuit according to claim 12, wherein the coils are formed by metal traces having thickness between 800 nm and 10 μm.

* * * * *

UNITED STATES PATENT AND TRADEMARK OFFICE
CERTIFICATE OF CORRECTION

PATENT NO.        : 7,199,684 B2
APPLICATION NO.   : 11/045500
DATED             : April 3, 2007
INVENTOR(S)       : Aigner et al.

It is certified that error appears in the above-identified patent and that said Letters Patent is hereby corrected as shown below:

On the Title Page:
The following should be added to section (73) Assignee:

Nokia Corporation, Espoo (FI)

Signed and Sealed this

Tenth Day of June, 2008

JON W. DUDAS
*Director of the United States Patent and Trademark Office*